(12) United States Patent
Kim

(10) Patent No.: US 10,334,197 B2
(45) Date of Patent: Jun. 25, 2019

(54) AMPLIFICATION CIRCUIT PERFORMING PRIMARY AND SECONDARY AMPLIFICATIONS

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 24 days.

(21) Appl. No.: 15/428,216

(22) Filed: Feb. 9, 2017

(65) Prior Publication Data

US 2017/0347048 A1 Nov. 30, 2017

(30) Foreign Application Priority Data

May 30, 2016 (KR) .......................... 10-2016-0066308

(51) Int. Cl.
*H04N 5/225* (2006.01)
*H04N 5/378* (2011.01)
*H03F 3/217* (2006.01)
*G09G 3/00* (2006.01)

(52) U.S. Cl.
CPC ............... *H04N 5/378* (2013.01); *G09G 3/00* (2013.01); *H03F 3/2171* (2013.01)

(58) Field of Classification Search
CPC ...................................................... H04N 5/378
USPC ......................................................... 348/374
See application file for complete search history.

(56) References Cited

U.S. PATENT DOCUMENTS

| 2012/0113286 A1* | 5/2012 | Lim | ..................... H03M 1/144 348/222.1 |
| 2015/0123532 A1* | 5/2015 | Kwon | ..................... F25D 23/04 312/404 |
| 2015/0123832 A1* | 5/2015 | Sohn | ..................... H03K 5/1252 341/164 |

FOREIGN PATENT DOCUMENTS

| JP | 2010-50590 | 4/2010 |
| KR | 1020010048965 | 6/2001 |

* cited by examiner

*Primary Examiner* — Usman A Khan
(74) *Attorney, Agent, or Firm* — IP & T Group LLP

(57) ABSTRACT

An amplification circuit includes a first amplification block suitable for primarily amplifying a voltage difference between a first voltage and a second voltage corresponding to a first input current and a second input current, respectively, and a second amplification block suitable for secondarily amplifying the voltage difference between the first and second voltages to generate an amplification signal.

9 Claims, 5 Drawing Sheets

AMPLIFICATION CIRCUIT PERFORMING PRIMARY AND SECONDARY AMPLIFICATIONS

CROSS-REFERENCE TO RELATED APPLICATIONS

The present application claims priority under 35 U.S.C 119(a) to Korean Patent Application No. 10-2016-0066308, flied on May 30, 2016, which is incorporated herein by reference in its entirety.

BACKGROUND

1. Field

Various embodiments of the present invention relate generally to a design technology of an integrated circuit and, more particularly, to an amplification circuit, a method for driving the same, and an image sensing device including the amplification circuit.

2. Description of the Related Art

Generally, integrated circuits are required to operate at higher speeds and consume less current. For improving the performance of integrated circuits, sensing and amplifying valid data, which includes comparing data with a reference value, has become an essential operating process of the integrated circuits.

Generally, in an integrated circuit, an amplification circuit may function as a comparator. The comparator compares a voltage level or a current amount of a target signal with a reference value and amplifies the comparison result.

Particularly, as a comparator, a latch-type amplifier may operate at high speed with low power consumption based on a positive feedback structure in which an output of the comparator influences an input to the comparator.

However, the latch-type amplifier may not output an intended amplification result due to an offset mainly caused by variations in device characteristics such as transistor characteristics. In addition, the latch-type amplifier may not output an intended amplification result even when noise and line coupling interference influence an input to the amplifier.

Image sensing devices include a plurality of amplification circuits serving as comparators. Image sensing devices capture images using photosensitive properties of semiconductors. Image sensing devices are often classified into charge-coupled device (CCD) image sensors and complementary metal-oxide semiconductor (CMOS) image sensors. CMOS image sensors allow both analog and digital control circuits to be integrated in a single integrated circuit (IC), making CMOS image sensors the most widely used type of image sensor.

SUMMARY

Various embodiments of the present invention are directed to an amplification circuit that is less sensitive to variations in device characteristics, to noise and line coupling interference. Various embodiments of the present invention are also directed to a method for driving the amplification circuit, and an image sensing device including the amplification circuit.

In accordance with an embodiment of the present invention, an amplification circuit includes: a first amplification block suitable for primarily amplifying a voltage difference between a first voltage and a second voltage corresponding to a first input current and a second input current, respectively; and a second amplification block suitable for secondarily amplifying the voltage difference between the first and second voltages to generate an amplification signal.

The first amplification block may include: a first charging unit suitable for charging the first input current; and a second charging unit suitable for charging the second input current.

The first charging unit may be coupled between a first input node where the first input current is inputted and a ground terminal where a ground voltage is supplied, and the second charging unit may be coupled between a second input node where the second input current is inputted and the ground terminal.

The first voltage may correspond to a voltage of the first input node, and the second voltage may correspond to a voltage of the second input node.

The second amplification block may include a latch-type amplifier.

The second amplification block may include: a first amplification unit suitable for generating the first amplification signal that swings within a range between a supply voltage and the ground voltage based on the first voltage; and a second amplification unit suitable for generating the second amplification signal that swings within a range between the supply voltage and the ground voltage based on the second voltage.

The second amplification block may further include: a first switching unit suitable for selectively coupling an input node of the second amplification unit, where the second voltage is inputted, to an output node of the first amplification unit, where the first amplification signal is outputted, in response to a first control signal; and a second switching unit suitable for selectively coupling an input node of the first amplification unit, where the first input voltage is inputted, to an output node of the second amplification unit, where the second amplification signal is outputted, in response to the first control signal.

The second amplification block may further include: a first switching unit suitable for selectively coupling an input path of the first amplification unit, where the first voltage is inputted, in response to a first control signal; and a second switching unit suitable for selectively coupling an input path of the second amplification unit, where the second voltage is inputted, in response to the first control signal.

The second amplification block may further include: a third switching unit suitable for selectively supplying the supply voltage to the first amplification unit in response to a second control signal; and a fourth switching unit suitable for selectively supplying the supply voltage to the second amplification unit in response to the second control signal.

In accordance with another embodiment of the present invention, a method for driving an amplification circuit includes: charging first and second charging units with first and second input currents, respectively, during a first period; and amplifying a voltage difference between first and second voltages loaded onto the first and second charging units, respectively, during a second period.

The amplifying of the voltage difference may be carried out by first and second amplification units, wherein the first and second amplification units may be disabled during the first period.

In accordance with yet another embodiment of the present invention, an image sensing device includes: a pixel array suitable for generating a plurality of pixel signals; a plurality of amplification circuits suitable for comparing the pixel signals to a ramp signal to generate a plurality of amplification signals corresponding to the pixel signals; and a plurality of signal conversion circuit suitable for generating a plurality of digital signals based on the amplification signals, wherein each of the amplification circuits comprises: a first amplification block suitable for, during a first period, primarily amplifying a voltage difference between a first voltage and a second voltage corresponding to a first input current and a second input current, respectively, based on a first control signal; and a second amplification block suitable for, during a second period, secondarily amplifying the voltage difference between the first and second voltages to generate an amplification signal, based on the first control signal and a second control signal.

The first amplification block may include: a current source suitable for generating a source current using a supply voltage; a first current generation unit suitable for selectively generating the first input current corresponding to the pixel signal using the source current, in response to a first control signal; a first charging unit suitable for charging the first input current; a second current generation unit suitable for selectively generating the second input current corresponding to the ramp signal using the source current, in response to the first control signal; and a second charging unit suitable for charging the second input current.

The first charging unit may be coupled between a first input node where the first current is inputted and a ground terminal where a ground voltage is supplied; and the second charging unit may be coupled between a second input node where the second current is inputted and the ground terminal.

The first voltage may correspond to a voltage of the first input node, and the second voltage may correspond to a voltage of the second input node.

The second amplification block may include a latch-type amplifier.

The second amplification block may include: a first amplification unit suitable for generating the first amplification signal that swings within a range between a supply voltage and the ground voltage based on the first voltage; and a second amplification unit suitable for generating the second amplification signal that swings within a range between the supply voltage and the ground voltage based on the second voltage.

The amplification block may further include: a first switching unit suitable for selectively coupling an input node of the second amplification unit, where the second voltage is inputted, to an output node of the first amplification unit, where the first amplification signal is outputted, in response to the first control signal; a second switching unit suitable for selectively coupling an input node of the first amplification unit, where the first input voltage is inputted, to an output node of the second amplification unit, where the second amplification signal is outputted, in response to the first control signal; a third switching unit suitable for selectively supplying the supply voltage to the first amplification unit in response to the second control signal; a fourth switching unit suitable for selectively supplying the supply voltage to the second amplification unit in response to the second control signal; a first initialization unit suitable for initializing the output node of the first amplification unit by a predetermined voltage based on the second control signal; and a second initialization unit suitable for initializing the output node of the second amplification unit by the predetermined voltage based on the second control signal.

The second amplification block may further include: a first switching unit suitable for selectively coupling an input path of the first amplification unit, where the first voltage is inputted, in response to the first control signal; a second switching unit suitable for selectively coupling an Input path of the second amplification unit, where the second voltage is inputted, in response to the first control signal; a third switching unit suitable for selectively supplying the supply voltage to the first amplification unit in response to the second control signal; a fourth switching unit suitable for selectively supplying the supply voltage to the second amplification unit in response to the second control signal; a first initialization unit suitable for initializing the output node of the first amplification unit with a predetermined voltage, which includes the supply voltage or the ground voltage or a voltage between the supply voltage and the ground voltage, based on the second control signal; and a second initialization unit suitable for initializing the output node of the second amplification unit with the predetermined voltage based on the second control signal.

The first control signal may include a clock signal, and the second control signal may include a complementary clock signal.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples of the invention and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "Includes," and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
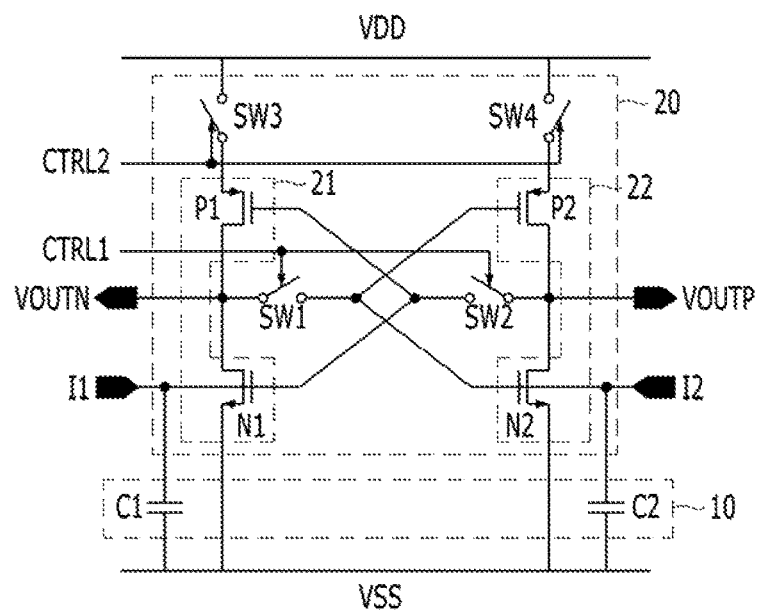
FIG. 1 is a diagram illustrating an amplification circuit according to an embodiment of the present invention.

Referring now to FIG. 1, an amplification circuit is provided, according to a first embodiment of the present invention. The amplification circuit may include a first amplification block 10 and a second amplification block 20.

The first amplification block 10 may primarily amplify a voltage difference between a first voltage and a second voltage which correspond to a first input current I1 and a second input current I2, respectively. That is, the first amplification block 10 may provide a voltage bias (i.e., the voltage difference between the two input paths) to the amplification block 20 based on a current difference between the first input current I1 and the second input current I2. For example, the first amplification block 10 may amplify the voltage difference between the first voltage and the second voltage by charging the first input current I1 and the second input current I2 where the current difference exists therebetween during a predetermined time period (hereinafter referred to as a "first amplification period"). When the difference between current amounts of the first input current I1 and the second input current I2 exists, a charge amount charged by the first input current I1 and a charge amount charged by the second input current I2 in the respective first and second charging units C1 and C2 are different. Accordingly, the voltage bias may be generated during the first amplification period. The voltage bias may depend upon variations in device characteristics such as transistor characteristics of the second amplification block 20, line coupling interference, and noise in addition to the current amounts of the first input current I1 and the second input current I2. Further, the voltage bias may vary by design, e.g., by controlling the values for the input currents I1 and I2 and the capacitances of the capacitors and which are included in the input block 10.

According to the embodiment of FIG. 1, the first amplification block 10 may include a first charging unit C1, and a second charging unit C2. The first charging unit C1 may be charged with the first input current I1. The first charging unit C1 may be coupled between a ground terminal VSS and a first input node through which the first input current I1 flows. For example, the first charging unit C1 may include a first capacitor. The second charging unit C2 may be charged with the second current I2. The second charging unit C2 may be coupled between the ground terminal VSS and a second input node through which the second input current I2 flows. For example, the second charging unit C2 may include a second capacitor.

The second amplification block 20 may secondarily amplify the voltage difference between the first input node and the second input node to generate first and second amplification signals VOUTN and VOUTP. A voltage level of the first input node may correspond to a voltage loaded onto the first charging unit C1. Further, a voltage level of the second input node may correspond to a voltage loaded onto the second charging unit C2. The second amplification block 20 may be disabled during the first amplification period and enabled during a second amplification period subsequent to the first amplification period, in response to first and second control signals (i.e., period control signals) CTRL1 and CTRL2.

The second amplification block 20 may include a latch-type amplifier. For example, the second amplification block 20 may include a first amplification unit 21, a second amplification unit 22, a first switching unit SW1, a second switching unit SW2, a third switching unit SW3, and a fourth switching unit SW4.

The first amplification unit 21 may generate the first amplification signal VOUTN that swings within a range between a supply voltage VDD and the ground voltage VSS based on a voltage level of the first input node. For example, the first amplification unit 21 may include a first PMOS transistor P1 and a first NMOS transistor N1. The first PMOS transistor P1 may have a gate coupled to the first input node, a source coupled to a supply voltage terminal VDD, and a drain terminal coupled to a first output node where the first amplification signal VOUTN is outputted. The first NMOS transistor N1 may have a gate coupled to the first input node, a source terminal coupled to the ground terminal VSS, and a drain coupled to the first output node.

The second amplification unit 22 may generate the second amplification signal VOUTP that swings within a range between the supply voltage VDD and the ground voltage VSS based on a voltage level of the second input node. For example, the second amplification unit 22 may include a second PMOS transistor P2 and a second NMOS transistor N2. The second PMOS transistor P2 may have a gate coupled to the second input node, a source coupled to the supply voltage terminal VDD, and a drain coupled to a second output node where the second amplification signal VOUTP is outputted. The second NMOS transistor N2 may have a gate coupled to the second input node, a source coupled to the ground terminal VSS, and a drain coupled to the second output node.

The first switching unit SW1 may selectively couple the second input node to the first output node in response to the first control signal CTRL1. The first switching unit SW1 may not couple the second input node to the first output node during the charging period, and may couple the second input node to the first output node during the second amplification period, in response to the first control signal CTRL1. For example, the first switching unit SW1 may include a switching transistor.

The second switching unit SW2 may selectively couple the first input node to the second output node in response to the first control signal CTRL1. The second switching unit SW2 may not couple the first input node to the second output node during the first amplification period, and may coupe the first input node to the second output node during the second amplification period, in response to the first control signal CTRL1. For example, the second switching unit SW2 may include a switching transistor.

The third switching unit SW3 may selectively supply the supply voltage VDD to the first amplification unit 21 in response to the second control signal CTRL2. The third switching unit SW3 may not supply the supply voltage VDD to the first amplification unit 21 during the first amplification period and may supply the supply voltage VDD to the first amplification unit 21 during the second amplification period, in response to the second control signal CTRL2. For example, the third switching unit SW3 may include a third switching element.

The fourth switching unit SW4 may selectively supply the supply voltage VDD to the second amplification unit 22 in response to the second control signal CTRL2. The fourth switching unit SW4 may not supply the supply voltage VDD to the second amplification unit 22 during the first amplification period and may supply the supply voltage VDD to the second amplification unit 22 during the second amplification period, in response to the second control signal CTRL2.

Figure 2:
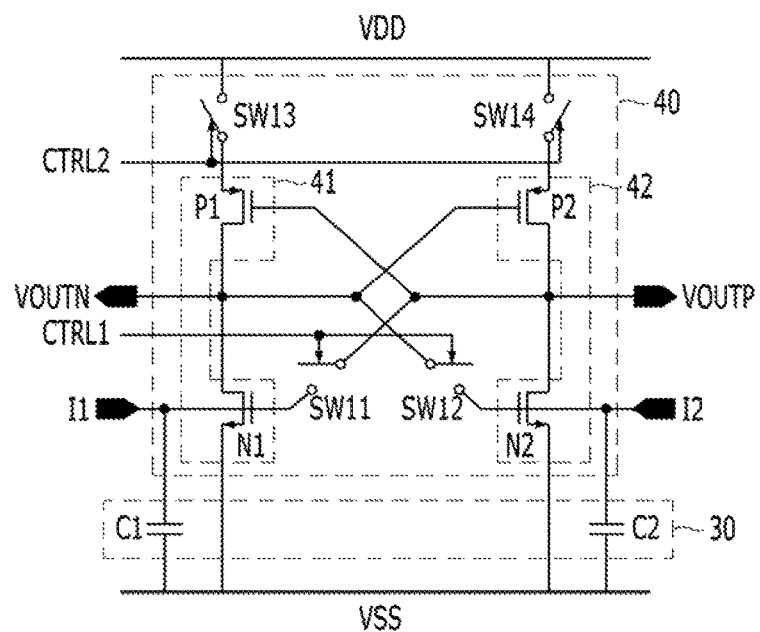
FIG. 2 is a diagram illustrating an amplification circuit according to another embodiment of the present invention.

FIG. 2 is a diagram illustrating an amplification circuit according to another embodiment of the present invention.

Referring to FIG. 2, the amplification circuit may include a first amplification block 30 and a second amplification block 40.

Since the first amplification block 30 may have a configuration similar to the first amplification block 10 shown in FIG. 1, detailed descriptions thereof will be omitted.

The second amplification block 40 may include a latch-type amplifier. For example, the second amplification block 40 may include a first amplification unit 41, a second amplification unit 42, a first switching unit SW11, a second switching unit SW12, a third switching unit SW13, and a fourth switching unit SW14. Since the first amplification unit 41, the second amplification unit 42, the third switching unit SW13 and the fourth switching unit SW14 are substantially the same as the first amplification unit 21, the second amplification unit 22, the third switching unit SW3 and the fourth switching unit SW4 shown in FIG. 1.

The first switching unit SW11 may electrically connect or disconnect an input path of the first amplification unit 41 in response to a first control signal CTRL1. The first switching unit SW11 may electrically disconnect the input path of the first amplification unit 41 during a charging period, and may electrically connect the input path of the first amplification unit 41 during an second amplification period, in response to the first control signal CTRL1. The input path of the first amplification unit 41 may include a path where a first current I1 is inputted.

The second switching unit SW12 may electrically connect or disconnect an input path of the second amplification unit 42 in response to the first control signal CTRL1. The second switching unit SW12 may electrically disconnect the input path of the second amplification unit 42 during the first amplification period, and may electrically connect the input path of the second amplification unit 42 during the second amplification period, in response to the first control signal CTRL1. The input path of the second amplification unit 42 may include a path where a second current I2 is inputted.

Hereinafter, an operation of the amplification circuit in accordance with an embodiment of the present invention is described.

The operation of the amplification circuit will be described in reference to the embodiment of FIG. 1 only as a representative example. It should be understood that the amplification circuit of FIG. 2 may be operated in the same manner.

Figure 3:
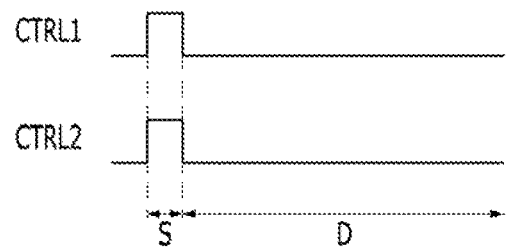
FIG. 3 is a timing diagram for describing an operation of the amplification circuit shown in FIG. 1.

Referring to FIG. 3, the first amplification block 10 may amplify the voltage difference between the first input node and the second input node based on the current difference between the first input current I1 and the second input current I2, during the first amplification period S. For example, the first amplification block 10 may amplify the voltage difference between the first input node and the second input node by charging the first charging unit C1 and the second charging unit C2 with the first input current I1 and the second input current I2, respectively, during the first amplification period S. When the amounts of the first input current I1 and the second input current I2 are different, the amounts of charges charged in the first charging unit C1 and the second charging unit C2 for each unit time are to be different. A difference between the charge amounts corresponds to the voltage difference between a voltage loaded onto the first charging unit C1 and a voltage loaded onto the second charging unit C2.

The voltage difference may be determined in consideration of variations in device characteristics (i.e., transistor characteristics) of the second amplification block 20, line coupling interference, and noise in addition to the current amounts of the first input current I1 and the second input current I2. Accordingly, when the voltage difference is sufficient to overcome the variations in device characteristics, the variations in device characteristics may be ignored during an amplification operation of the second amplification block 20. Although the line coupling interference, and noise temporarily influence the first input current I1 or the second input current I2, the voltage difference between two input nodes may not be reversed.

The second amplification block 20 may be disabled during the first amplification period S in response to the first and second control signals CTRL1 and CTRL2. For example, the second amplification block 20 may electrically disconnect the first input node from the second output node during the first amplification period S and may electrically disconnect the second input node from the first output node during the first amplification period S, in response to the first control signal CTRL1. The supply voltage VDD may not be supplied to the second amplification block 20 during the first amplification period S in response to the second control signal CTRL2.

The second amplification block 20 may be enabled during the second amplification period D in response to the first and second control signals CTRL1 and CTRL2. For example, the second amplification block 20 may couple the first input node to the second output node during the second amplification period D, and may couple the second input node to the first output node during the second amplification period D, in response to the first control signal CTRL1. The supply voltage VDD may be supplied to the second amplification block 20 during the second amplification period D in response to the second control signal CTRL2.

The second amplification block 20 may amplify the voltage difference between the first input node and the second input node during the second amplification period D. For example, the second amplification block 20 may generate the first amplification signal VOUTN that swings within a range between the supply voltage VDD and the ground voltage VSS based on the voltage of the first input node, and generate the second output signal VOUTP that swings within a range between the supply voltage VDD and the ground voltage VSS based on the voltage of the second input node.

In accordance with an embodiment of the present invention, as an amount of difference between two inputs may be secured sufficiently in advance before a substantive amplification operation is performed, the amplification circuit may ignore variations in device characteristics (i.e., transistor characteristics), and thus the amplification circuit may be insensitive to noise, line coupling interference and so on when the substantive amplification operation is performed.

Hereinafter, an example of an integrated circuit where amplification circuits are applied will be described. Although an image sensing device is described as an example of the integrated circuit in embodiments of the present invention, the invention is not limited to the image sensing device and may be implemented with any other suitable integrated circuit.

Figure 4:
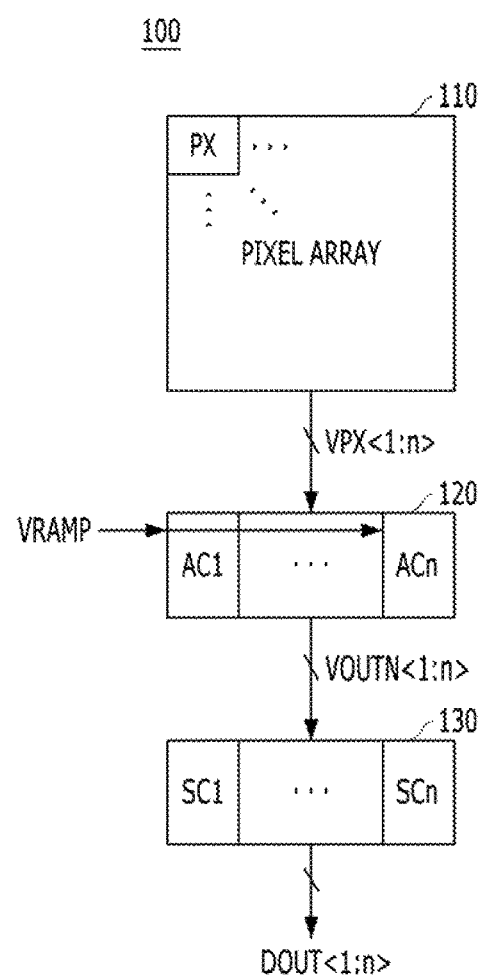
FIG. 4 is a block diagram illustrating an image sensing device according to an embodiment of the present invention.

FIG. 4 is a block diagram illustrating an image sensing device 100 according to an embodiment of the present invention.

Referring to FIG. 4, the image sensing device 100 may include a pixel array 110, a comparison unit 120, and a signal conversion unit 130. The comparison unit 120 may include first to $n^{th}$ amplification circuits AC1 to ACn, and the signal conversion unit 130 may include first to $n^{th}$ signal conversion circuits SC1 to SCn.

The pixel array 110 may include a plurality of pixels PXs arranged in n rows and m columns. For example, the pixel array 110 may include n*m pixels PXs. The pixel array 110 may generate first to $n^{th}$ pixel signals VPX<1:n> for each unit row time.

The first to $n^{th}$ amplification circuits AC1 to ACn may generate first to $n^{th}$ amplification signals VOUTN<1:n>, respectively, in response to the first to $n^{th}$ pixel signals VPX<1:n> and a ramp signal VRAMP. For example, a first amplification circuit AC1, corresponding to a first column, may generate a first current corresponding to the first pixel signal VPX<1> and a second current corresponding to the ramp signal VRAMP, amplify a voltage difference corresponding to the first current and the second current based on a current difference therebetween to generate a first amplification signal (or a first comparison signal) VOUTN<1> corresponding to the first pixel signal VPX<1>. The first amplification signal VOUTN<1> may have a toggling period determined according to a voltage level of the first pixel signal VPX<1>.

The first to $n^{th}$ signal conversion circuits SC1 to SCn may generate first to $n^{th}$ digital signals DOUT<1:n> in response to the first to $n^{th}$ amplification signals VOUTN<1:n>. For example, a first signal conversion circuit SC1 may count the toggling number of the first amplification signal VOUTN<1> to generate the first digital signal DOUT<1>. Here, each signal conversion circuit may include a counter and a memory. Further, the first amplification circuit AC1 and the first signal conversion circuit SC1 may form a unit analog-to-digital converter.

Figure 5:
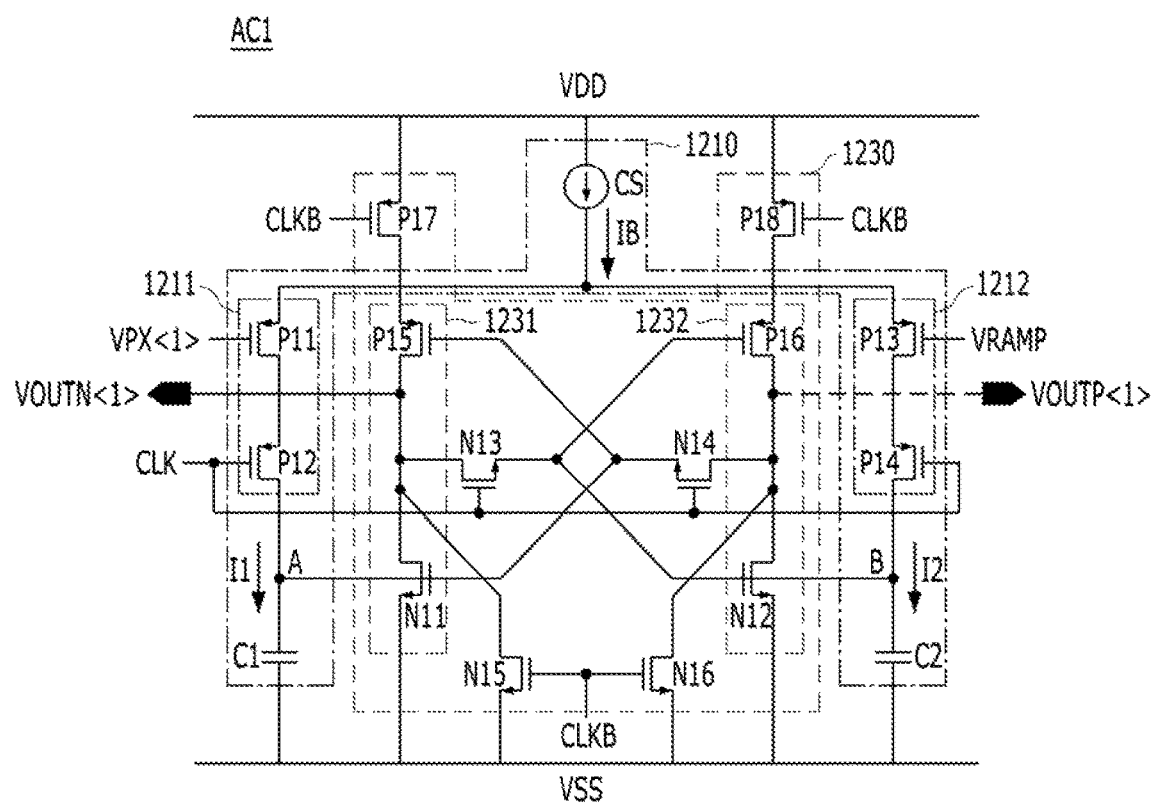
FIG. 5 is a detailed diagram of a first amplification circuit shown in FIG. 4.

FIG. 5 is a detailed diagram of the first amplification circuit AC1 shown in FIG. 4. Referring to FIG. 5, the first amplification circuit AC1 may include a first amplification block 1210 and a second amplification block 1230.

The first amplification block 1210 may generate a first current I1 corresponding to the first pixel signal VPX<1> and a second current I2 corresponding to the ramp signal VRAMP in response to a clock signal CLK, and generate a first input voltage corresponding to the first current I1 and a second input voltage corresponding to the second current I2. A voltage difference between the first voltage and the second voltage may be determined based on the current difference between the first current I1 and the second current I2. For example, the first amplification block 1210 may obtain the voltage difference between the first voltage and the second voltage for each cycle of the clock signal CLK.

The first amplification block 1210 may include a current source CS, a first current generation unit 1211, a first charging unit C1, a second current generation unit 1212, and a second charging unit C2.

The current source CS may generate a source current IB using supply voltage VDD.

The first current generation unit 1211 may selectively generate the first current I1 corresponding to the first pixel signal VPX<1> using the source current IB, in response to the clock signal CLK. For example, the first current generation unit 1211 may include first and second PMOS transistors P11 and P12. The first PMOS transistor P11 may have a gate receiving the first pixel signal VPX<1>, a source coupled to the current source CS, and a drain coupled to the second PMOS transistor P12. The second PMOS transistor P12 may have a gate receiving the clock signal CLK, a source coupled to the first PMOS transistor P11, and a drain coupled to the first charging unit C1. The first current generation unit 1211 may generate the first current I1 corresponding to a voltage level of the first pixel signal VPX<1> during the first amplification period (i.e., when the clock signal CLK has a low logic level), and may not generate the first current I1 during the second amplification period subsequent to the first amplification period (i.e., when the clock signal CLK has a high logic level).

The first charging unit C1 may be charged with the first current I1 during the first amplification period. For example, the first charging unit C1 may include a first capacitor. The first capacitor may be coupled between the drain of the second PMOS transistor P12 and a ground terminal VSS where a ground voltage VSS is supplied. Hereinafter, a node A between the second PMOS transistor P12 and the first charging unit C1 is referred to as a "first input node."

The second current generation unit 1212 may selectively generate the second current I2 corresponding to the ramp signal VRAMP using the source current IB, in response to the clock signal CLK. For example, the second current generation unit 1212 may include third and fourth PMOS transistors P13 and P14. The third PMOS transistor P13 may have a gate receiving the ramp signal VRAMP, a source coupled to the current source CS, and a drain coupled to the fourth PMOS transistor P14. The fourth PMOS transistor P14 may have a gate receiving the clock signal CLK, a source coupled to the third PMOS transistor P13, and a drain coupled to the second charging unit C2. The second current generation unit 1212 may generate the second current I2 corresponding to a voltage level of the ramp signal VRAMP during the first amplification period (i.e., when the clock signal CLK has a low logic level), and may not generate the second current I2 during the amplification period (i.e., when the clock signal CLK has the high logic level).

The second charging unit C2 may be charged with the second current I2 during the second amplification period. For example, the second charging unit C2 may include a second capacitor. The second capacitor may be coupled between the drain of the fourth PMOS transistor P14 and the ground terminal VSS. Hereinafter, a node B between the fourth PMOS transistor P14 and the second charging unit C2 is referred to as a "second input node."

The second amplification block 1230 may amplify the voltage difference between the first voltage and the second voltage in response to a complementary clock signal CLKB to generate first amplification signals (or first comparison signals) VOUTN<1> and VOUTP<1>, which have complementary phases. The complementary clock signal CLKB may be an inverted signal of the clock signal CLK. The first amplification signal VOUTN<1> may be a negative output signal corresponding to the first pixel signal VPX<1> outputted to the first signal conversion circuit SC1, and the first amplification signal VOUTP<1> may be a positive output signal corresponding to the first pixel signal VPX<1>. Although it is described in the embodiment of the present invention that the first negative output signal VOUTN<1> is used as the first comparison signal described in FIG. 4, which is to be transferred to the first signal conversion circuit SC1, the invention is not limited to this, and it is possible to use the first positive output signal VOUTP<1> as the first amplification signal (i.e., the first comparison signal). The first voltage may correspond to a voltage loaded onto the first charging unit C1. In other words, the first voltage may be a voltage of the first input node A. The second voltage may correspond to a voltage loaded onto the second charging unit C2. In other words, the second voltage may be a voltage of the second input node B. The second amplification block 1230 may be disabled during the first amplification period and enabled during the second amplification period, in response to the complementary clock signal CLKB.

The second amplification block 1230 may include a latch-type amplifier. For example, the second amplification block 1230 may include a first amplification unit 1231, a second amplification unit 1232, a first switching unit N13, a second switching unit N14, a third switching unit P17, a fourth switching unit P18. The second amplification block 1230 may further include a first initialization unit N15, and a second initialization unit N16.

The first amplification unit 1231 may generate the first amplification signal VOUTN<1> that swings within a range between the supply voltage VDD and the ground voltage VSS based on the first voltage. For example, the first amplification unit 1231 may include a fifth PMOS transistor P15 and a first NMOS transistor N11. The fifth PMOS transistor P15 may have a gate coupled to the first input node A, a source coupled to the third switching unit P17, and a drain coupled to a first output node outputting the first amplification signal VOUTN<1>. The first NMOS transistor N11 may have a gate coupled to the first input node A, and a source coupled to the ground terminal VSS, and a drain coupled to the first output node.

The second amplification unit 1232 may generate the first amplification signal VOUTP<1> that swings within a range between the supply voltage VDD and the ground voltage VSS based on the second voltage. For example, the second amplification unit 1232 may include a sixth PMOS transistor P16 and a second NMOS transistor N12. The sixth PMOS transistor P16 may have a gate coupled to the second input node B, and a source coupled to the fourth switching unit P18, and a drain coupled to a second output node outputting the first amplification signal VOUTP<1>. The second NMOS transistor N12 may have a gate coupled to the second input node B, a source coupled to the ground terminal VSS, and a drain coupled to the second output node.

The first switching unit N13 may selectively couple the second input node B to the first output node in response to the clock signal CLK. The first switching unit N13 may not couple the second input node B to the first output node during the first amplification period, and may couple the second input node B to the first output node during the second amplification period, in response to the clock signal CLK. For example, the first switching unit N13 may include a third NMOS transistor having a gate receiving the clock signal CLK, and source/drain coupled between the second input node B and the first output node.

The second switching unit N14 may selectively couple the first input node A to the second output node in response to the clock signal CLK. The second switching unit N14 may not couple the first input node A to the second output node during the first amplification period, and may couple the first input node A to the second output node during the second amplification period, in response to the clock signal CLK. For example, the second switching unit N14 may include a fourth NMOS transistor having a gate receiving the clock signal CLK, and source/drain coupled between the first input node A and the second output node.

The third switching unit P17 may selectively supply the supply voltage VDD to the first amplification unit 1231 in response to the complementary clock signal CLKB. The third switching unit P17 may not supply the supply voltage VDD to the first amplification unit 1231 during the first amplification period, and may supply the supply voltage VDD to the first amplification unit 1231 during the second amplification period, in response to the complementary clock signal CLKB. For example, the third switching unit P17 may include a seventh PMOS transistor having a gate receiving the complementary clock signal CLKB, a source coupled to the supply voltage terminal VDD, and a drain coupled to the source of the fifth PMOS transistor P15.

The fourth switching unit P18 may selectively supply the supply voltage VDD to the second amplification unit 1232 in response to the complementary clock signal CLKB. The fourth switching unit P18 may not supply the supply voltage VDD to the second amplification unit 1232 during the first amplification period, and may supply the supply voltage VDD to the second amplification unit 1232 during the second amplification period, in response to the complementary clock signal CLKB. For example, the fourth switching unit P18 may include a eighth PMOS transistor having a gate receiving the complementary clock signal CLKB, a source coupled to the supply voltage terminal VDD, and a drain coupled to the source terminal of the sixth PMOS transistor P16.

The first initialization unit N15 may initialize the first output node by the ground voltage VSS in response to the complementary clock signal CLKB (i.e., during the first amplification period). For example, the first initialization unit N15 may include a fifth NMOS transistor having a gate receiving the complementary clock signal CLKB, a source coupled to the ground terminal VSS, and a drain coupled to the first output node.

The second initialization unit N16 may initialize the second output node by the ground voltage VSS in response to the complementary clock signal CLKB (i.e., during the first amplification). For example, the second initialization unit N16 may include a sixth NMOS transistor having a gate receiving the complementary clock signal CLKB, and a source coupled to the ground terminal VSS, and a drain coupled to the second output node. Although it is described in the embodiment of the present invention that the ground voltage VSS is used as an output node initialization voltage, the invention is not limited to this, and the supply voltage VDD or an intermediate voltage (e.g., VDD/2) raging between the supply voltage VDD and the ground voltage VSS may be used as the output node initialization voltage, by design.

Figure 6:
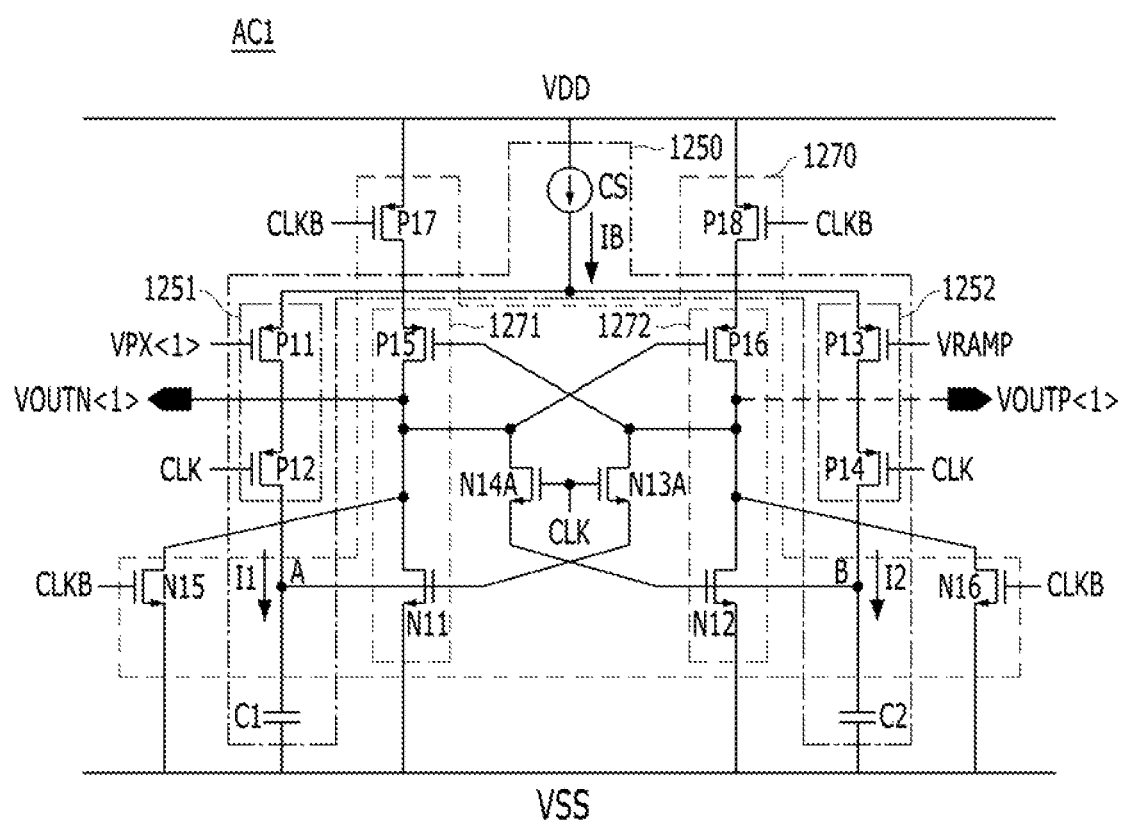
FIG. 6 is another detailed diagram of the first amplification circuit shown in FIG. 4.

FIG. 6 is another detailed diagram of the first amplification circuit AC1 shown in FIG. 4. Referring to FIG. 6, the first amplification circuit AC1 may include an first amplification block 1250 and a second amplification block 1270.

Since the first amplification block 1250 may have a configuration substantially the same as the first amplification block 1210 shown in FIG. 5, descriptions of the first amplification block 1250 will be omitted.

The second amplification block 1270 may include a latch-type amplifier, and may have a configuration similar to the second amplification block 1230 shown in FIG. 5 except for a first switching unit N13A and a second switching unit N14A. The second amplification block 1270 may include a first amplification unit 1271, a second amplification unit 1272, the first switching unit N13A, the second switching unit N14A, a third switching unit P17, a fourth switching unit P18, a first initialization unit N15, and a second initialization unit N16. Since the first amplification unit 1271, the second amplification unit 1272, the third switching unit P17, the fourth switching unit P18, the first initialization unit N15, and the second initialization unit N16 are substantially the same as those shown in FIG. 5, descriptions of the first switching unit N13A and the second switching unit N14A will be provided hereafter.

The first switching unit N13A may electrically connect or disconnect an input path of the first amplification unit 1271 in response to the clock signal CLK. The first switching unit N13A may electrically disconnect the input path of the first amplification unit 1271 during the first amplification period, and may electrically connect the input path of the first amplification unit 1271 during the second amplification period, in response to the clock signal CLK. The input path of the first amplification unit 1271 may include a path where the first voltage is inputted. For example, the first switching unit N13A may include an NMOS transistor having a gate receiving the clock signal CLK, and source/drain coupled between the first input node A and the second output node.

The second switching unit N14A may electrically connect or disconnect an input path of the second amplification unit 1272 in response to the clock signal CLK. The second switching unit N14A may electrically disconnect the input path of the second amplification unit 1272 during the first amplification period, and may electrically connect the input path of the second amplification unit 1272 during the second amplification period, in response to the clock signal CLK. The input path of the second amplification unit 1272 may include a path where the second voltage is inputted. For example, the second switching unit N14A may include an NMOS transistor having a gate receiving the clock signal CLK, and source/drain coupled between the second input node B and the first output node.

Figure 7:
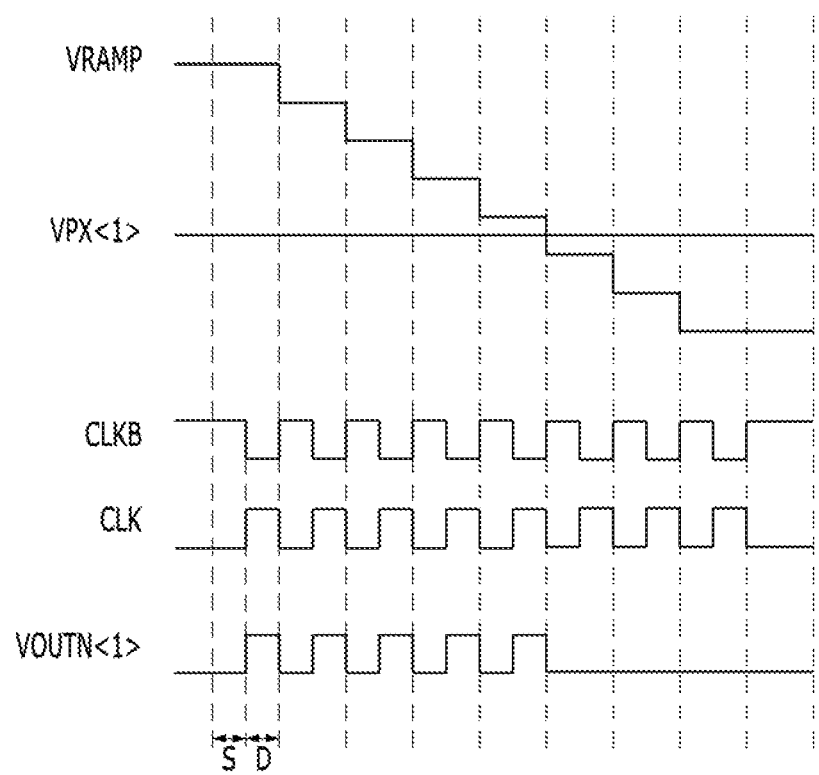
FIG. 7 is a timing diagram for describing an operation of the image sensing device shown in FIG. 4.

FIG. 7 is a timing diagram for describing an operation of the image sensing shown in FIG. 4. For convenience in description, it may be seen that FIG. 7 illustrates just an operation related to the first pixel signal VPX<1>.

Referring to FIG. 7, the pixel array 110 may generate the first pixel signal VPX<1>. The first pixel signal VPX<1> may have a voltage level corresponding to incident light.

The first amplification circuit AC1 may compare the first pixel signal VPX<1> with the ramp signal VRAMP to generate the first amplification signal VOUTN<1>. For example, the ramp signal VRAMP may decrease by a step (corresponding to a predetermined voltage level) for each comparison period during a ramping period, and the first amplification circuit AC1 may compare the first pixel signal VPX<1> with the ramp signal VRAMP for each comparison period to generate the first amplification signal VOUTN<1> in response to the clock signal CLK and the complementary clock signal CLKB. The clock signal CLK and the complementary clock signal CLKB may toggle during the ramping period. A single cycle of the clock signal and the complementary clock signal CLKB may correspond to one comparison period. Further, one comparison period may include one first amplification period S and one second amplification period D. A comparison operation of the first amplification circuit AC1 that is performed for each comparison period will be described in detail below.

The first amplification circuit AC1 may generate a first current I1 corresponding to the first pixel signal VPX<1> and a second current I2 corresponding to the ramp signal VRAMP in response to the clock signal CLK and the complementary clock signal CLKB, and generate a first input voltage corresponding to the first current I1 and a second input voltage corresponding to the second current I2. A voltage difference between the first voltage and the second voltage corresponding to the first current I1 and the second current I2 may be determined based on the current difference between the first current I1 and the second current I2 during the first amplification period S of the comparison period.

Subsequently, the first amplification circuit AC1 may secondarily amplify the voltage difference between the first voltage and the second voltage during the second amplification period D of the comparison period, to generate the first amplification signal VOUTN<1> corresponding to the first pixel signal VPX<1>. The first amplification circuit AC1 may initialize the first amplification signal VOUTN<1> with the ground voltage VSS during the first amplification period S. Hence, the first amplification signal VOUTN<1> may toggle, for example, during a period during which a voltage level of the first pixel signal VPX<1> is lower than a voltage level of the ramp signal VRAMP.

The first signal conversion circuit SC1 may generate the first digital signal DOUT<1> in response to the first amplification signal VOUTN<1>. For example, the first signal conversion circuit SC1 may count the toggling number of the first amplification signal VOUTN<1> to generate the first digital signal DOUT<1>.

In accordance with an embodiment of the present invention, the image sensing device may ignore variations (or an offset) in device characteristics (i.e., transistor characteristics), and be insensitive to noise, line coupling interference and so on when the voltage difference between the pixel signal and the ramp signal is amplified. Thus, with adjusting an amount of input current and capacitances of capacitors included in the input block, the voltage difference that is sufficient to ignore an offset of an amplification circuit may be obtained prior to an amplification operation (i.e., a comparison operation), and therefore, the reliability of the amplification operation may be improved.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. An image sensing device, comprising:
 a pixel array suitable for generating a plurality of pixel signals;
 a plurality of amplification circuits suitable for comparing the pixel signals to a ramp signal to generate a plurality of amplification signals corresponding to the pixel signals; and
 a plurality of signal conversion circuit suitable for generating a plurality of digital signals based on the amplification signals,
 wherein each of the amplification circuits comprises:
 a first amplification block suitable for, during a first period, primarily amplifying a voltage difference between a first voltage and a second voltage corresponding to a first input current flowing through a first input node and a second input current flowing through a second input node, respectively, based on a first control signal; and
 a second amplification block coupled between the first input node and the second input node, and suitable for, during a second period, secondarily amplifying the voltage difference between the first and second voltages to generate an amplification signal, based on the first control signal and a second control signal.

2. The image sensing device of claim 1, wherein the first amplification block includes:
 a current source suitable for generating a source current using a supply voltage;

a first current generation unit suitable for selectively generating the first input current corresponding to the pixel signal using the source current, in response to a first control signal;

a first charging unit suitable for charging the first input current;

a second current generation unit suitable for selectively generating the second input current corresponding to the ramp signal using the source current, in response to the first control signal; and a second charging unit suitable for charging the second input current.

3. The image sensing device of claim 2, wherein the first charging unit is coupled between a first input node where the first current is inputted and a ground terminal where a ground voltage is supplied; and the second charging unit is coupled between a second input node where the second current is inputted and the ground terminal.

4. The image sensing device of claim 3, wherein the first voltage corresponds to a voltage of the first input node, and the second voltage corresponds to a voltage of the second input node.

5. The image sensing device of claim 1, wherein the second amplification block includes a latch-type amplifier.

6. The image sensing device of claim 5, wherein the second amplification block includes:

a first amplification unit suitable for generating the first amplification signal that swings within a range between a supply voltage and the ground voltage based on the first voltage; and a second amplification unit suitable for generating the second amplification signal that swings within a range between the supply voltage and the ground voltage based on the second voltage.

7. The amplification circuit of claim 6, wherein the amplification block further includes:

a first switching unit suitable for selectively coupling an input node of the second amplification unit, where the second voltage is inputted, to an output node of the first amplification unit, where the first amplification signal is outputted, in response to the first control signal;

a second switching unit suitable for selectively coupling an input node of the first amplification unit, where the first input voltage is inputted, to an output node of the second amplification unit, where the second amplification signal is outputted, in response to the first control signal;

a third switching unit suitable for selectively supplying the supply voltage to the first amplification unit in response to the second control signal;

a fourth switching unit suitable for selectively supplying the supply voltage to the second amplification unit in response to the second control signal;

a first initialization unit suitable for initializing the output node of the first amplification unit by a predetermined voltage based on the second control signal; and a second initialization unit suitable for initializing the output node of the second amplification unit by the predetermined voltage based on the second control signal.

8. The image sensing device of claim 6, wherein the second amplification block further includes:

a first switching unit suitable for selectively coupling an input path of the first amplification unit, where the first voltage is inputted, in response to the first control signal;

a second switching unit suitable for selectively coupling an input path of the second amplification unit, where the second voltage is inputted, in response to the first control signal;

a third switching unit suitable for selectively supplying the supply voltage to the first amplification unit in response to the second control signal;

a fourth switching unit suitable for selectively supplying the supply voltage to the second amplification unit in response to the second control signal;

a first initialization unit suitable for initializing the output node of the first amplification unit with a predetermined voltage, which includes the supply voltage or the ground voltage or a voltage between the supply voltage and the ground voltage, based on the second control signal; and a second initialization unit suitable for initializing the output node of the second amplification unit with the predetermined voltage based on the second control signal.

9. The image sensing device of claim 1, wherein the first control signal includes a clock signal, and the second control signal includes a complementary clock signal.

* * * * *